United States Patent
Miyazaki et al.

(10) Patent No.: US 8,685,775 B2
(45) Date of Patent: Apr. 1, 2014

(54) GROUP III NITRIDE SEMICONDUCTOR LIGHT-EMITTING DEVICE AND PRODUCTION METHOD THEREFOR

(75) Inventors: Atsushi Miyazaki, Kiyosu (JP); Koji Okuno, Kiyosu (JP); Shugo Nitta, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 13/593,240

(22) Filed: Aug. 23, 2012

(65) Prior Publication Data
US 2013/0059407 A1 Mar. 7, 2013

(30) Foreign Application Priority Data
Sep. 6, 2011 (JP) ................................. 2011-193948

(51) Int. Cl.
*H01L 33/02* (2010.01)
(52) U.S. Cl.
USPC .......................................................... 438/46
(58) Field of Classification Search
USPC .......... 438/22, 37, 45–47; 257/79, 86, 94, 99, 257/101–103, E33.001, E33.062, E33.063
See application file for complete search history.

(56) References Cited

U.S. PATENT DOCUMENTS

| | | | |
|---|---|---|---|
| 6,204,084 B1 * | 3/2001 | Sugiura et al. | 438/46 |
| 6,206,962 B1 * | 3/2001 | Kijima et al. | 117/108 |
| 8,304,793 B2 * | 11/2012 | Yoshizumi et al. | 257/95 |
| 2002/0190263 A1 * | 12/2002 | Hata et al. | 257/103 |
| 2003/0010983 A1 * | 1/2003 | Ohbo et al. | 257/76 |
| 2004/0056259 A1 * | 3/2004 | Goto et al. | 257/79 |
| 2004/0101986 A1 * | 5/2004 | Kozaki et al. | 438/22 |
| 2004/0213309 A9 * | 10/2004 | Amano et al. | 372/45 |
| 2005/0035360 A1 * | 2/2005 | Tanizawa | 257/97 |
| 2005/0035362 A1 * | 2/2005 | Nitta et al. | 257/98 |
| 2005/0037526 A1 * | 2/2005 | Kamiyama et al. | 438/22 |
| 2005/0224783 A1 * | 10/2005 | Matsuyama et al. | 257/14 |
| 2006/0131558 A1 * | 6/2006 | Sato et al. | 257/17 |
| 2007/0029558 A1 * | 2/2007 | Nishizono | 257/96 |
| 2008/0048194 A1 * | 2/2008 | Kudo et al. | 257/94 |
| 2008/0118999 A1 * | 5/2008 | Komada | 438/46 |
| 2009/0001409 A1 * | 1/2009 | Takano et al. | 257/103 |
| 2009/0206325 A1 | 8/2009 | Biwa et al. | |

(Continued)

FOREIGN PATENT DOCUMENTS

| | | | |
|---|---|---|---|
| CN | 101645480 A | * | 2/2010 |
| JP | 09307190 A | * | 11/1997 |

(Continued)

*Primary Examiner* — Michele Fan
(74) *Attorney, Agent, or Firm* — McGinn IP Law Group, PLLC

(57) ABSTRACT

On a light-emitting layer, a p cladding layer of AlGaInN doped with Mg is formed at a temperature of 800° C. to 950° C. Subsequently, on the p cladding layer, a capping layer of undoped GaN having a thickness of 5 Å to 100 Å is formed at the same temperature as employed for a p cladding layer. Next, the temperature is increased to the growth temperature contact layer in the subsequent process. Since the capping layer is formed, and the surface of the p cladding layer is not exposed during heating, excessive doping of Mg or mixture of impurities into the p cladding layer is suppressed. The deterioration of characteristics of the p cladding layer is prevented. Then, on the capping layer, a p contact layer is formed at a temperature of 950° C. to 1100° C.

13 Claims, 2 Drawing Sheets

(56) References Cited

U.S. PATENT DOCUMENTS

| | | |
|---|---|---|
| 2009/0212277 A1* | 8/2009 | Akita et al. .................. 257/13 |
| 2009/0242874 A1 | 10/2009 | Biwa et al. |
| 2010/0133506 A1* | 6/2010 | Nakanishi et al. ............ 257/13 |
| 2011/0204394 A1* | 8/2011 | Hikosaka et al. ............. 257/94 |
| 2011/0212560 A1* | 9/2011 | Sumitomo et al. ............ 438/47 |
| 2011/0309328 A1* | 12/2011 | Kyono et al. ................. 257/13 |
| 2011/0312117 A1* | 12/2011 | Suzuki et al. ................. 438/47 |
| 2012/0049157 A1* | 3/2012 | Nago et al. ................... 257/13 |
| 2012/0145992 A1* | 6/2012 | Yoo et al. ..................... 257/13 |
| 2012/0248456 A1* | 10/2012 | Takano et al. ................ 257/76 |
| 2012/0327967 A1* | 12/2012 | Enya et al. ............... 372/45.011 |

FOREIGN PATENT DOCUMENTS

| | | | |
|---|---|---|---|
| JP | 2000-164512 A | | 6/2000 |
| JP | 2001094212 A | * | 4/2001 |
| JP | 2007-080996 A | | 3/2007 |
| JP | 2010183030 A | * | 8/2010 |

* cited by examiner

GROUP III NITRIDE SEMICONDUCTOR LIGHT-EMITTING DEVICE AND PRODUCTION METHOD THEREFOR

BACKGROUND OF THE INVENTION

1. Field of the Invention

The present invention relates to a method for producing a Group III nitride semiconductor light-emitting device, whose characteristic feature resides in a process for forming an n-type layer, and more particularly a process that can prevent the deterioration of characteristics of the p cladding layer. Moreover, the Group III nitride semiconductor light-emitting device whose characteristic feature resides in a structure of the p-type layer.

2. Background Art

A Group III nitride semiconductor light-emitting device has a structure mainly comprising a substrate on which am n-type layer, a light-emitting layer, and a p-type layer are sequentially deposited. The p-type layer has a structure in which a p cladding layer, and a p contact layer are sequentially deposited in this order on the light-emitting layer.

The p cladding layer, for example, is an AlGaN single layer or has a superlattice structure in which AlGaN and InGaN or AlGaN and GaN are alternately deposited more than once. The p cladding layer is grown at a low temperature of 800° C. to 950° C. to reduce thermal damage to the light-emitting layer.

The p contact layer is formed of, for example, p-GaN doped with Mg at a high concentration. The p contact layer is grown at temperature of 950° C. to 1100° C., which is higher than the growth temperature of the p cladding layer to improve crystal quality.

In order to grow the p cladding layer at a low temperature, and the p contact layer at a high temperature, conventionally, after the p cladding layer was grown, crystal growth is stopped and the temperature is increased. Then, the p contact layer is grown.

As a technique related to the present invention, there is Japanese Patent Application Laid-Open (kokai) No. 2000-164512 or 2007-80996. Japanese Patent Application Laid-Open (kokai) No. 2000-164512 discloses a Group III nitride semiconductor light-emitting device wherein a p-AlGaN capping layer, a p-GaN optical waveguide layer, a p-AlGaN p cladding layer, and a p-GaN p contact layer are sequentially deposited on a light-emitting layer.

Japanese Patent Application Laid-Open (kokai) No. 2007-80996 discloses a Group III nitride semiconductor light-emitting device wherein a GaN layer having a thickness or 100 nm and a Mg concentration of $5 \times 10^{19}/cm^3$ is formed between a p cladding layer having a superlattice structure in which AlGaN and GaN are alternately deposited more than once, and a p contact layer formed of InGaN doped with Mg.

However, during heating for formation of the p contact layer after the p cladding layer was formed, Mg is excessively doped into the p cladding layer or other impurities are mixed into the crystal due to the exposed surface of the p cladding layer. This causes adverse effect on characteristics, such as increased resistivity of the p cladding layer.

Moreover, in Japanese Patent Application Laid-Open (kokai) No. 2000-164512 or 2007-80996, there is no description about a deterioration of characteristics of the p cladding layer. Japanese Patent Application Laid-Open (kokai) No. 2007-80996 does not reveal for what purpose the GaN layer is formed between the p cladding layer and the p contact layer.

SUMMARY OF THE INVENTION

In view of the foregoing, an object of the present invention is to provide a method for producing a Group III nitride semiconductor light-emitting device, which can form a p cladding layer without deteriorating characteristics.

In a first aspect of the present invention, there is provided a method for producing a Group III nitride semiconductor light-emitting device having a p cladding layer, and a contact layer on the p cladding layer, the method comprising the steps of:

forming the p cladding layer at a first growth temperature;
forming a capping layer of Group III nitride semiconductor undoped or doped with Mg at a concentration of $5 \times 10^{19}/cm^3$ or less on the p cladding layer at the first growth temperature;
increasing the temperature to a second growth temperature higher than the first growth temperature; and
forming the p contact layer on the capping layer at the second growth temperature.

The capping layer may be grown while heating within a range not exceeding the second growth temperature as long as the first growth temperature is achieved at the start of the growth. The capping layer may be grown with the first growth temperature maintained.

The capping layer preferably has a thickness of 5 Å to 100 Å. When the thickness of the capping layer is within this range, excessive doping of Mg or mixture of impurities into the p cladding Layer can be prevented during heating in the subsequent process. Thus, the function not to deteriorate the characteristics of the p cladding layer can be fully achieved. More preferably, the capping layer has a thickness of 5 Å to 20 Å.

The capping layer may be formed of any Group III nitride semiconductor. GaN or InGaN is preferably used in terms of crystallinity or controllability. GaN is particularly preferably used. When InGaN is used, the In composition ratio to the number of moles of the total Group III atoms is preferably, more than 0 mol % and 10 mol % or less. That is $0 < 100y \leq 10$, in $In_yGa_{1-y}N$. Hereinafter the In composition ratio is defined as In mol percent when the mol percent of the total Group III atoms is 100 mol %. Moreover, the capping layer may be doped with Mg at a concentration of $5 \times 10^{19}/cm^3$ or less, or undoped. Even if the capping layer is intentionally undoped, Mg is taken into the capping layer due to memory effect with respect to a gas flow. Therefore, both when the capping layer is doped with Mg and when it is intentionally undoped, the p-type capping layer is obtained through the subsequent thermal treatment. More preferably, the capping layer has a Mg concentration of $1 \times 10^{19}/cm^3$ to $5 \times 10^{19}/cm^3$. Although the capping layer may comprise a plurality of layers with different Mg concentrations or composition ratios, it is preferably a single layer because the number of production processes increases, and the thickness of the capping layer itself increases.

Preferably, the first growth temperature is 800° C. to 950° C., and the second growth temperature is 950° C. to 1100° C. When the growth temperature is within this range, the effect of preventing the deterioration of characteristics of the p cladding layer by the capping layer can be fully achieved as well as the cladding layer and a p contact layer with good crystallinity can be grown.

The p cladding layer may be a single layer or a plurality of layers, for example, a superlattice structure. When the p cladding layer is a single layer, the p cladding layer can be formed of AlGaInN having an Al composition ratio of more than 0 mol % and 50 mol % or less to the number of moles of the total Group III atoms, and an In composition ratio of 0 mol % or more and 10 mol % or less to the number of moles of the total Group III atoms. That is $0 < 100x \leq 50$ and $0 \leq 100y \leq 10$, in $Al_xGa_{1-x-y}In_yN$. More preferably, AlGaInN has an Al composition ratio of 25 mol % to 35 mol % to the number of moles of the total Group III atoms, and an In composition ratio of 1 mol % to 6 mol % to the number of moles of the total Group III atoms. That is 25≤100x≤35 and 1≤100y≤6, in $Al_xGa_{1-x-y}In_yN$. Moreover, the p cladding layer has a superlattice structure, the p cladding layer can have structure in which AlGaN having an Al composition ratio or more than 0 mol % and 50 mol % or less to the number of moles of the total Group III atoms, and InGaN having an In composition ratio of 0 mol %, or more and 10 mol % or less to the number of moles of the total Group III atoms are alternately deposited more than once. More preferably, the p cladding layer has a superlattice structure in which AlGaN having an Al composition ratio of 27 mol % to 31 mol % to the number of moles of the total Group III atoms, and InGaN having an In composition ratio of 4 mol % to 6 mol % to the number of moles of the total Group III atoms are alternately deposited more than once. The p cladding layer may be doped with Mg.

The p contact layer may be a single layer or a plurality layers with different Mg concentrations or composition ratios. When the p contact layer is a single layer, the p contact layer can be formed of GaN doped with Mg or InGaN doped with Mg. When the p contact layer comprises a plurality of layers, the p contact layer can be a plurality of layers (for example, GaN), each layer haying a Mg concentration so that the more distant from the capping layer, the higher the Mg concentration. Such a structure of the p contact layer can reduce the contact resistance to the p electrode. When the p contact layer comprises a plurality of layers, the top layer of the p contact layer, which is in contact with the p electrode, may be formed of InGaN to reduce the contact resistance to the p electrode.

In a second part of the present invention is drawn to a specific embodiment of the method for producing a Group III nitride semiconductor light-emitting device according to the first aspect, wherein the capping layer is formed so as to have a thickness of 5 Å to 100 Å.

In a third aspect of the present invention is drawn to a specific embodiment of the method for producing a Group III nitride semiconductor light-emitting device according to the second aspect, wherein the capping layer is formed so as to have a thickness of 5 Å to 20 Å.

A fourth aspect of the present invention is drawn to a specific embodiment of the Group III nitride semiconductor light-emitting device according to any one of the first to third aspect, wherein the capping layer is formed of InGaN having an In composition ratio of 0 mol % to 10 mol % to the number of moles of the total Group III atoms. The case where the In composition ratio is 0 mol % to the number moles of the total Group III atoms, that is, the capping layer is formed of GaN, is included.

A fifth aspect of the present invention is drawn to a specific embodiment of the Group III nitride semiconductor light-emitting device according any one of the first to fourth aspect, wherein the first growth temperature is 800° C. to 950° C., and the second growth temperature is 950° C. to 1100° C.

A sixth aspect of the present invention is drawn to a specific embodiment of the Group III nitride semiconductor light-emitting device according to any one of the first to fifth aspect, wherein the p cladding layer is a single layer formed of AlGaInN having an Al composition ratio of more than 0 mol % and 50 mol % or less to the number of moles of the total Group III atoms, and an In composition ratio of 0 mol % or more and 10 mol % or less to the number to the total Group III atoms.

A seventh aspect of the present invention is drawn to a specific embodiment of the Group III nitride semiconductor light-emitting device according to any one of the first fifth aspect, wherein the p cladding layer has a superlattice structure in which having an Al composition ratio of more than 0 mol % and 50 mol % or less to the number of moles of the total Group III atoms, and InGaN having an In composition ratio of 0 mol % or more and 10 mol % or less to the number of moles of the total Group III atoms are alternately deposited more than once.

A eighth aspect of the present invention is drawn to a specific embodiment of the Group III nitride semiconductor light-emitting device according to any one of the first so seventh aspect, wherein the p contact layer comprises a plurality of layers with different Mg concentrations, each layer having a Mg concentration so that the more distant from the capping layer, the higher the Mg concentration.

A ninth aspect of the present invention is a Group III nitride semiconductor light-emitting device having p cladding layer and a p contact layer on the p cladding layer, wherein the capping layer is formed of GaN having a Mg concentration of $5×10^{19}/cm^3$ or less, a thickness of 5 Å to 100 Å between the p cladding layer and the p contact layer.

In the present invention, between the p cladding layer and the p contact layer, the capping layer is formed of Group III nitride semiconductor undoped or doped with Mg at a concentration of $5×10^{19}/cm^3$ or less at the same growth temperature (first growth temperature) as employed for the p cladding layer. After the formation of the capping layer, the temperature is increased to the same temperature (second growth temperature as employed for the p contact layer. Since the surface of the p cladding layer is covered with the capping layer during heating, thereby excessive doping of Mg or mixture of impurities is suppressed. Thus, the deterioration of characteristics of the p cladding layer can be prevented.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
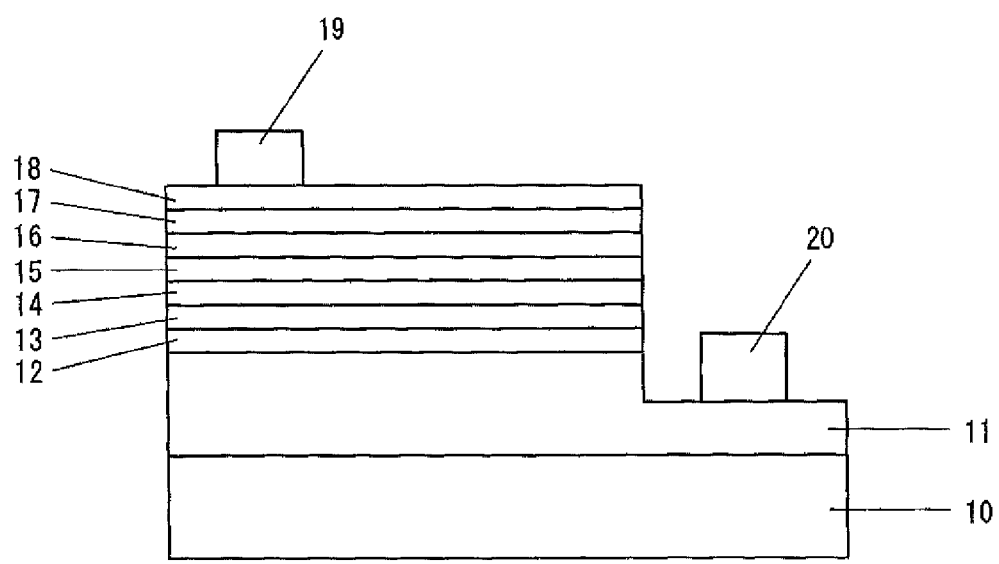
FIG. 1 shows the configuration of a Group III nitride semiconductor light-emitting device according to Embodiment 1.

FIG. 1 shows the configuration of a Group III nitride semiconductor light-emitting device according to Embodiment 1. The Group III nitride semiconductor light-emitting device according to Embodiment 1 includes a sapphire substrate 10; and a n contact layer 11, an ESD layer 12, an n cladding layer 13, a light-emitting layer 14, a p cladding layer 15, a capping layer 16, and a p contact layer 17, which are sequentially deposited via an AlN buffer layer (not illustrated) on the sapphire substrate 10. A trench with a depth reaching the surface of the n contact layer 11 is formed on a portion of the p contact layer 17, and an n electrode 20 is formed on the surface of the n contact layer 11 exposed at the bottom of the trench. An ITO transparent electrode 18 is formed on almost the entire top surface of the p contact layer 17 except for the trench, and a p electrode 19 is formed on the transparent electrode 18.

A dot-like or stripe-like convex and concave pattern may be formed on the surface on the n contact layer 11 side of the sapphire substrate 10 to improve light extraction performance. The sapphire substrate may be replaced with a growth substrate formed from, for example, SiC, Si, ZnO, spinel, GaN, or $Ga_2O_3$.

The n contact layer 11 is formed of n-GaN with a Si concentration of $1 \times 10^{18}/cm^3$ or more. To reduce the contact resistance with the n electrode 16, the n contact layer 11 may be formed of a plurality of layers with different Si concentrations.

The ESD layer 12 has a three-layer structure including a first ESD layer, a second ESD layer, and a third ESD layer, the layers being sequentially deposited on the n contact layer 11. The first ESD layer has pits (pit density: $1 \times 10^8/cm^2$ or less) on the surface at the light-emitting layer 14 side thereof. The first ESD layer is formed of GaN having a thickness of 200 nm to 1000 nm and a Si concentration of $1 \times 10^{16}$ to $5 \times 10^{17}/cm^3$. The second ESD layer has pits (pit density: $2 \times 10^8/cm^2$ or more) on the surface at the light-emitting layer 14 side thereof. The second ESD layer is formed of GaN having a thickness of 50 nm to 200 nm and a carrier concentration of $5 \times 10^{17}/cm^3$ or less. The third ESD layer is formed of GaN, and has a characteristic value, as defined by the product of Si concentration ($/cm^3$) and thickness (nm), of $0.9 \times 10^{20}$ to $3.6 \times 10^{20}/cm^3$). Such a structure of the ESD layer can improve electrostatic breakdown voltage, emission performance, and reliability, and reduce the current leakage.

The n cladding layer 13 has a superlattice structure including fifteen layer units, each including an InGaN layer, an AlGaN layer, and a Si doped n-GaN layer, which are deposited in this order. The initial layer of the n cladding layer 13, which is in contact with the third ESD layer of the ESD layer 12, is the InGaN layer, and the final layer of the n cladding layer 13, which is in contact with the light-emitting layer 14 is the n-GaN layer. Such a structure of the n cladding layer 13 can effectively prevent holes from leaking from the light-emitting layer to the n cladding layer 13, and can improve light emission performance.

The light-emitting layer 14 has a MQW structure in which a well layer of undoped InGaN and a barrier layer of undoped AlGaN are alternately and repeatedly deposited. A capping layer (different from the capping layer of the present invention) of AlGaN having an Al composition ratio below that of the barrier layer may be formed between the well layer and the barrier layer at the same growth temperature as employed for the well layer. Since such a capping layer prevents In from evaporating from the well layer during heating for formation of the barrier layer, light emission performance can be improved. A layer of undoped GaN and undoped AlGaN may be formed between the light-emitting layer 14 and the p cladding layer 15 to prevent Mg from diffusing from the p cladding layer 15 to the light-emitting layer 14.

The p cladding layer 15 is a single layer formed of p-AlGaInN having a thickness of 275 Å. The Al composition ratio to the number of moles of the total Group III atoms is more than 0 mol % and 50 mol % or less. The In composition ratio to the number of moles of the total Group III atoms is 0 mol % or more and 10 mol % or less. The AlGaInN layer having such an Al composition ratio can prevent holes from leaking from the light-emitting layer 14, and can improve light emission performance. More preferably, the p cladding layer 15 is a single layer formed of AlGaInN having an Al composition ratio of 25 mol % to 35 mol % to the number of moles of the total Group III atoms, and an In composition ratio of 1 mol % to 6 mol % to the number of moles of the total Group III atoms. Mg is used as a p-type impurity of the p cladding layer 15, and the Mg concentration is $1 \times 10^{20}/cm^3$ to $2 \times 10^{20}/cm^3$.

The p cladding layer 15 may have a superlattice structure, for example, in which a p-AlGaN layer and p-InGaN layer are alternately deposited more than once. The p-AlGaN layer and the p-InGaN layer preferably have a Mg concentration of $1 \times 10^{20}/cm^3$ to $2 \times 10^{20}/cm^3$. The AlGaN layer preferably has an Al composition ratio of more than 0 mol % and 50 mol % less to the number of moles of the total Group III atoms. The InGaN layer preferably has an In composition ratio of 0 mol % or more and 10 mol % or less to the number of moles of the total Group III atoms. More preferably, the AlGaN layer has an Al composition ratio of 27 mol % to 31 mol % to the number of moles of the total Group III atoms, and the InGaN layer has an In composition ratio of 4 mol % to 6 mol % to the number of moles of the total Group III atoms.

The capping layer 16 is a single layer formed of undoped GaN having a thickness of 5 Å to 100 Å. Even if the capping layer 16 is undoped, i.e., not intentionally doped, Mg with a concentration of $5 \times 10^{18}/cm^3$ to $5 \times 10^{19}/cm^3$ is mixed in the crystal due to memory effect with respect to a gas flow. The provision of such a capping layer 16 between the p cladding layer 15 and the p contact layer 17 can prevent excessive doping of Mg or contamination of impurities, and the deterioration of characteristics of the p cladding layer 15. The capping layer 1 preferably has a thickness of 5 Å to 20 Å. More preferably the thickness is 5 Å to 10 Å.

The capping layer 16 may be a single layer formed of InGaN having an In composition ratio of more than 0 mol % and 10 mol % or less to the number or moles of the total Group III atoms. When the In composition ratio is within this range, the capping layer 16 with good crystallinity can be formed.

More generally, the capping layer 16 may be a Group III nitride semiconductor ($Al_xGa_yIn_zN$ (x+y+z=1, 0≤x, y, z≤1)). However, as mentioned above, $In_xGa_yN$ (x+y=1, 0≤x≤0.1) is preferable in terms or crystallinity or controllability when forming the Group III nitride semiconductor.

The capping layer 16 may be doped with Mg at a concentration of $5 \times 10^{19}/cm^3$ or less. More preferably, Mg concentration is $1 \times 10^{19}/cm^3$ to $5 \times 10^{19}/cm^3$.

Although the capping layer 16 may comprise a plurality of layers with different Mg concentrations or composition ratios, it is preferably a single layer because the number of production processes increases, and the thickness of the capping layer 16 itself increases.

The p contact layer 17 comprises three layers: a first p contact layer, a second p contact layer, and a third p contact layer which are sequentially deposited on the capping layer 16. The first p contact layer is formed of GaN having a Mg concentration of $1 \times 10^{19}/cm^3$ to $3 \times 10^{19}/cm^3$ and a thickness of 320 Å. The second p contact layer formed of GaN having a Mg concentration of $4 \times 10^{19}/cm^3$ to $6 \times 10^{19}/cm^3$ and a thickness of 320 Å. The third p contact layer formed of GaN having a Mg concentration of $1 \times 10^{20}/cm^3$ to $2 \times 10^{20}/cm^3$ and a thickness of 80 Å. Such a structure of the p contact layer 17 can reduce the contact resistance with the transparent electrode 18 while maintaining crystallinity of the p contact layer 17. The third p contact layer being in contact with the transparent electrode 18 may be formed of InGaN instead of GaN. InGaN has a work function closer to that of the transparent electrode 18, a thereby the contact resistance with the transparent electrode 18 can be further reduced.

The transparent electrode 18 is formed on almost the entire top surface of the is contact layer 17. A transparent oxide conductive material such as ICO (cerium-doped indium oxide) or IZO (zinc-doped indium oxide) other than ITO, or a metal thin film such as Au can be used as a transparent electrode 18.

The p electrode 19, and the n electrode 20 may have structure comprising a pad which a wire is bonded, and a wiring extending (e.g. in a grid-like pattern, a comb pattern, or a radial pattern on each surface thereof for diffusing a current, which is connected to the pad.

Next will be described processes for producing the Group III nitride semiconductor light-emitting device according to Embodiment 1 with reference to FIGS. 2A to 2D.

Firstly, a sapphire substrate 10 was prepared. Thermal cleaning was performed in a hydrogen atmosphere to remove impurities from the surface of the sapphire substrate 10.

Figure 2A:
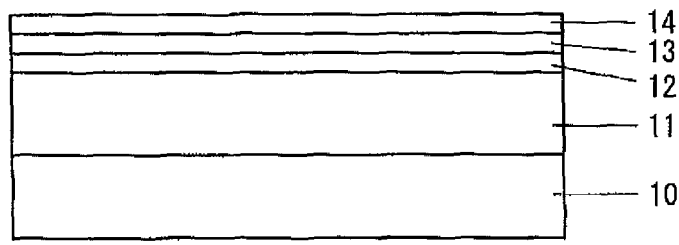
FIGS. 2A to 2D are sketches showing processes for producing the Group III nitride semiconductor light-emitting device according to Embodiment 1.

Subsequently, an AlN buffer layer (not illustrated), an n contact layer 11, an ESD layer 12, an n cladding layer 13, and a light-emitting layer 14 are sequentially deposited on the sapphire substrate 10 by MOCVD (FIG. 2A). The gases employed were as follows: TMG (trimethylgallium) as a Ga source; TMI (trimethylindium) as an In source; trimethylaluminum as an Al source; ammonia as a nitrogen source; and hydrogen or nitrogen as a carrier gas. Silane was employed as an n-type dopant gas.

Figure 2B:
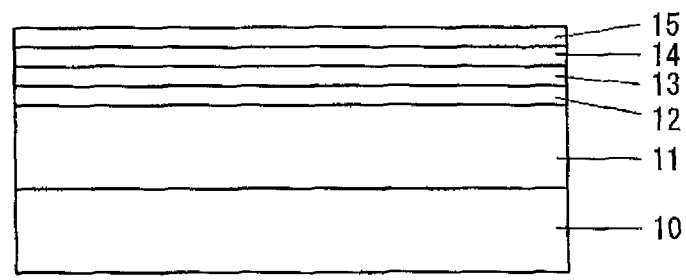

Next, on the light-emitting layer 14, by MOCVD, a p cladding layer 15 of Mg-doped AlGaInN having a thickness of 275 Å was formed at a temperature of 800° C. to 950° C. (the first growth temperature in the present invention) (FIG. 2B). Cp$_2$Mg (Biscyclopentadienylmagnesium) is used as a p-type dopant gas. The raw material gas and carrier gas are the same as mentioned above. The growth temperature of the p cladding layer 15 is more preferably 840° C. to 880° C. When the temperature is within this range, the p cladding layer 15 can be grown with better crystallinity.

Figure 2C:
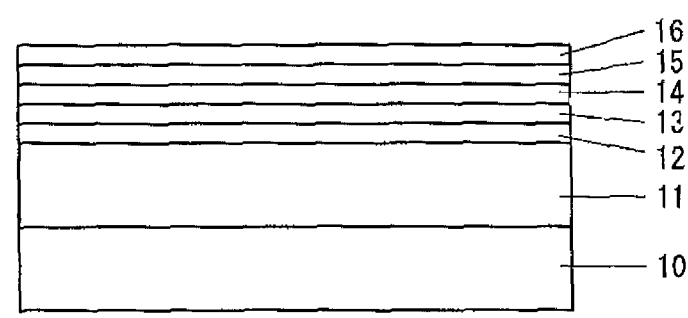

Subsequently, on the p cladding layer 15, by MOCVD, capping layer 16 of undoped GaN having a thickness of 5 Å to 100 Å was formed at the same temperature as employed for the p cladding layer 15 (FIG. 2C). The capping layer 16 is doped with Mg at a concentration of about $5\times10^{18}$/cm$^3$ to $5\times10^{19}$/cm$^3$ due to memory effect of a gas flow. The raw material gas and carrier gas are the same as above. The capping layer 16 may intentionally doped with Mg at a concentration of $5\times10^{19}$/cm$^3$ or less. More preferably, the Mg concentration is $1\times10^{19}$/cm$^3$ to $5\times10^{19}$/cm$^3$. Moreover, the capping layer 16 has more preferably a thickness of 5 Å to 20 Å. When the thickness is within this range, the impact on the device characteristics due to the provision of the capping layer 16 can be reduced. InGaN with an In composition ratio of more than 0% and 10% or less may be used as a capping layer 16.

In the present embodiment, the growth temperature of the capping layer 16 is maintained at the same temperature as employed for the p cladding layer 15. However, the capping layer may be formed at the same temperature as employed for the p cladding layer 15 at the start of the growth, and thereafter, while increasing the temperature within a range of less than or equal to the growth temperature of the p contact layer 17.

Next, the temperature was increased to the growth temperature of the p contact layer 17 in the subsequent process. The growth temperature of the p contact layer 17 is 950° C. to 1100° C. (the second growth temperature in the present invention). No capping layer 16 was conventionally formed, and the surface of the p cladding layer 15 was exposed. Therefore, Mg was excessively doped or impurities were mixed into the cladding layer 15 during heating, resulting in the deterioration of characteristics of the p cladding layer 15. However, since, in Embodiment 1, the capping layer 16 is formed, and the surface of the p cladding layer 15 is not exposed during heating, excessive doping of Mg or mixture of impurities into the p cladding layer 15 is suppressed. Therefore, the deterioration of characteristics of the p cladding layer 15 is prevented.

Figure 2D:
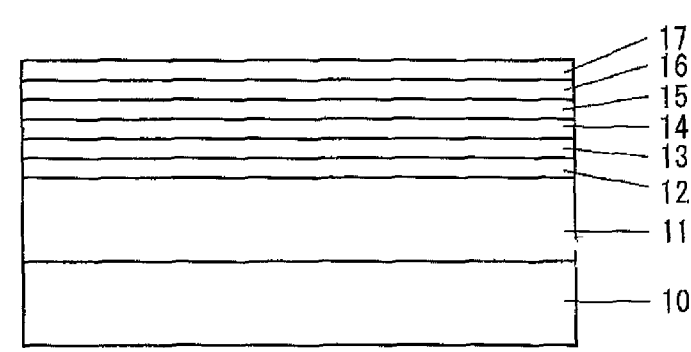

A p contact layer 17 was formed on the capping layer 16 at a temperature 950° C. to 1100° C. by MOCVD (FIG. 2D). The p contact layer 17 was formed by sequentially depositing a first contact layer, a second p contact layer, and a third p contact layer on the capping layer 16. The first p contact layer is formed of GaN having a Mg concentration of $1\times10^{19}$/cm$^3$ to $3\times10^{19}$/cm$^3$ and a thickness of 320 Å. The second p contact layer is formed of GaN having a Mg concentration $4\times10^{19}$/cm$^3$ to $6\times10^{19}$/cm$^3$ and a thickness of 320 Å. The third p contact layer is formed of GaN having a Mg concentration of $1\times10^{20}$/cm$^3$ to $2\times10^{20}$/cm$^3$ and a thickness of 80 Å. The raw material gas, carrier gas, and p-type dopant gas are the same as mentioned above.

Thereafter, a trench with a depth extending from the surface of the p contact layer 17 to the n contact layer 11 was formed by dry etching a portion of the p contact layer 17. Then, an ITO transparent electrode 18 was formed on almost the entire top surface of the p contact layer 17. A p electrode 19 was formed on the transparent electrode 18, and an n electrode 20 was formed on the n contact layer 11 exposed at the bottom of the trench. Through the above, the Group III nitride semiconductor light-emitting device according to Embodiment 1 as shown in FIG. 1 was produced.

In the Group III nitride semiconductor light-emitting device according to Embodiment 1, the deterioration of characteristics of the p cladding layer 15 is prevented by the above production method, thereby light emission performance or reliability of the light emitting device can be improved.

The Group III nitride semiconductor light-emitting device according to Embodiment 1 is of a face-up type. However, the present invention is not limited to this, and a Group III nitride semiconductor light-emitting device may have any structure, so long as it has a p cladding layer and a p contact layer. For example, the present invention can be applied to a flip-chip type device or a device having a vertical conductive structure obtained by using a conductive substrate or removing a substrate by a laser lift-off technique. Thus, as in Embodiment 1, the deterioration of characteristics of the p cladding layer can be prevented.

The Group III nitride semiconductor light-emitting device produced by the method of the present invention can be employed in an illumination apparatus, or a display apparatus.

What is claimed is:

1. A method for producing a Group III nitride semiconductor light-emitting device having a p cladding layer and a p contact layer on the p cladding layer, the method comprising:
    forming the p cladding layer at a first growth temperature;
    forming a capping layer on the p cladding layer, the capping layer being formed of Group III nitride semiconductor undoped or doped with Mg at a concentration of $5\times10^{19}$/cm$^3$ or less at the first growth temperature;
    increasing the temperature to a second growth temperature higher than the first growth temperature; and
    forming the p contact layer on the capping layer at the second growth temperature,
    wherein the capping layer is formed so as to have a thickness of 5 Å to 20 Å, the capping layer is formed of InGaN having an In composition ratio of 0 mol % to 10 mol % to a number of moles of a total Group III atoms in InGaN, the first growth temperature is 800° C. to 950° C., and the second growth temperature is 950° C. to 1100° C., a surface of the p cladding layer is not exposed during the increasing of the growth temperature from the first growth temperature to the second growth temperature.

2. The method for producing the Group III nitride semiconductor light-emitting device according to claim 1, wherein the p cladding layer is a single layer formed of AlGaInN having an Al composition ratio of more than 0 mol % and 50 mol % or less to the number of moles of the total Group III atoms in AlGaInN, and an In composition ratio of 0 mol % or more and 10 mol % or less to the number of moles of the total Group III atoms in AlGaInN.

3. The method for producing the Group III nitride semiconductor light-emitting device according to claim 2, wherein the p contact layer comprises a plurality of layers with different Mg concentrations, each layer having a Mg concentration so that the more distant from the capping layer, the higher the Mg concentration.

4. The method for producing the Group III nitride semiconductor light-emitting device according to claim 1, wherein the p cladding layer has a superlattice structure in which AlGaN having an Al composition ratio of more than 0 mol % and 50 mol % or less to the number of moles of the total Group III atoms in AlGaN, and InGaN having an In composition ratio of 0 mol % or more and 10 mol % or less to the number of moles of the total Group III atoms in InGaN are alternately deposited more than once.

5. The method for producing the Group III nitride semiconductor light-emitting device according to claim 4, wherein the p contact layer comprises a plurality of layers with different Mg concentrations, each layer having a Mg concentration so that the more distant from the capping layer, the higher the Mg concentration.

6. The method for producing the Group III nitride semiconductor light-emitting device according to claim 1, wherein the p contact layer comprises a plurality of layers with different Mg concentrations, each layer having a Mg concentration so that the more distant from the capping layer, the higher the Mg concentration.

7. The method for producing the Group III nitride semiconductor light-emitting device according to claim 6, wherein a top layer of the p contact comprises InGaN, to thereby provide a work function closer to that of a transparent electrode mounted on a top surface thereof.

8. A Group III nitride semiconductor light-emitting device, as fabricated using the method of claim 1.

9. A method for producing a Group III nitride semiconductor light-emitting device having a p cladding layer and a p contact layer on the p cladding layer, the method comprising:
forming the p cladding layer at a first growth temperature that is in a range of 800° C. to 950° C.;
forming a capping layer on the p cladding layer, the capping layer being formed of Group III nitride semiconductor undoped or doped with Mg at a concentration of $5 \times 10^{19}/cm^3$ or less at the first growth temperature;
increasing the temperature to a second growth temperature that is in a range of 950° C. to 1100° C.; and
forming the p contact layer on the capping layer at the second growth temperature,
wherein a surface of the p cladding layer is not exposed during the increasing of the growth temperature from the first growth temperature to the second growth temperature.

10. The method for producing the Group III nitride semiconductor light-emitting device according to claim 9, wherein the p cladding layer is a single layer formed of AlGaInN having an Al composition ratio of more than 0 mol % and 50 mol % or less to the number of moles of the total Group III atoms in AlGaInN, and an In composition ratio of 0 mol % or more and 10 mol % or less to the number of moles of the total Group III atoms in AlGaInN.

11. The method for producing the Group III nitride semiconductor light-emitting device according to claim 9, wherein the p cladding layer has a superlattice structure in which AlGaN having an Al composition ratio of more than 0 mol % and 50 mol % or less to the number of moles of the total Group III atoms in AlGaN, and InGaN having an In composition ratio of 0 mol % or more and 10 mol % or less to the number of moles of the total Group III atoms in InGaN are alternately deposited more than once.

12. The method for producing the Group III nitride semiconductor light-emitting device according to claim 9, wherein the p contact layer comprises a plurality of layers with different Mg concentrations, each layer having a Mg concentration so that the more distant from the capping layer, the higher the Mg concentration.

13. A Group III nitride semiconductor light-emitting device, as fabricated using the method of claim 9.

* * * * *